United States Patent
Misawa et al.

(10) Patent No.: US 11,567,249 B2
(45) Date of Patent: Jan. 31, 2023

(54) LIGHT ABSORBING DEVICE, MANUFACTURING METHOD THEREOF, AND PHOTOELECTRODE

(71) Applicant: National University Corporation Hokkaido University, Hokkaido (JP)

(72) Inventors: Hiroaki Misawa, Sapporo (JP); Xu Shi, Sapporo (JP); Kosei Ueno, Sapporo (JP); Tomoya Oshikiri, Sapporo (JP); Quan Sun, Sapporo (JP); Keiji Sasaki, Sapporo (JP)

(73) Assignee: National University Corporation Hokkaido University, Hokkaido (JP)

( * ) Notice: Subject to any disclaimer, the term of this patent is extended or adjusted under 35 U.S.C. 154(b) by 203 days.

(21) Appl. No.: 16/957,747

(22) PCT Filed: Dec. 25, 2018

(86) PCT No.: PCT/JP2018/047588
§ 371 (c)(1),
(2) Date: Jun. 25, 2020

(87) PCT Pub. No.: WO2019/131640
PCT Pub. Date: Jul. 4, 2019

(65) Prior Publication Data
US 2021/0294009 A1    Sep. 23, 2021

(30) Foreign Application Priority Data

Dec. 25, 2017  (JP) .............................. JP2017-248071

(51) Int. Cl.
*G02B 5/22*    (2006.01)
*G02B 5/28*    (2006.01)
(Continued)

(52) U.S. Cl.
CPC ................. *G02B 5/22* (2013.01); *G02B 5/28* (2013.01); *H01L 31/02162* (2013.01);
(Continued)

(58) Field of Classification Search
CPC ....... G02B 5/22; G02B 5/28; H01L 31/02162; H01L 31/02167
See application file for complete search history.

(56) References Cited

U.S. PATENT DOCUMENTS 6,384,318 B1 *   5/2002  Nomura ................ H01L 31/048
                                                     136/246
2012/0205747 A1   8/2012  Yamada et al.
(Continued)

FOREIGN PATENT DOCUMENTS

JP    2011-173261    9/2011
JP    2012-023326    2/2012
(Continued)

OTHER PUBLICATIONS

International Search Report and the Written Opinion dated Apr. 2, 2019 From the International Searching Authority Re. Application No. PCT/JP2018/047588 and Its Translation of Search Report Into English. (10 Pages).
(Continued)

*Primary Examiner* — Tae-Sik Kang

(57) ABSTRACT

This light absorbing device includes: a light reflecting layer; a dielectric layer disposed on the light reflecting layer; and a plurality of metal nanostructures disposed on the dielectric layer. A portion of each of the plurality of metal nanostructures is buried in the dielectric layer and another portion thereof is exposed to the outside.

7 Claims, 14 Drawing Sheets

(51) Int. Cl.
*H01L 31/0216* (2014.01)
*B82Y 20/00* (2011.01)
*B82Y 30/00* (2011.01)

(52) U.S. Cl.
CPC ........ *H01L 31/02167* (2013.01); *B82Y 20/00* (2013.01); *B82Y 30/00* (2013.01)

(56) References Cited

U.S. PATENT DOCUMENTS

2016/0153900 A1    6/2016   Kitazawa et al.
2016/0160364 A1*  6/2016   Juluri .................... C25B 11/051
                                                                   204/252

FOREIGN PATENT DOCUMENTS

JP    WO 2014/208144    12/2014
WO  WO 2019/131640     7/2019

OTHER PUBLICATIONS

Hedayati et al. "Design of A Perfect Black Absorber at Visible Frequencies Using Plasmonic Metamaterials", Advanced Materials, 23(45): 5410-5414, Published Online Oct. 14, 2011.
Liu et al. "Infrared Perfect Absorber and Is Application as Plasmonic Sensor", Nano Letters, 10(7): 2342-2348, Jul. 14, 2010.

* cited by examiner

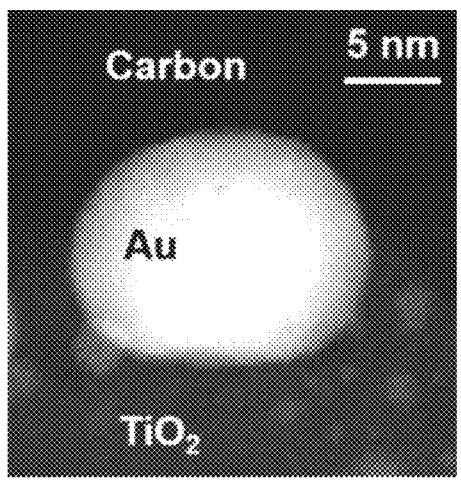
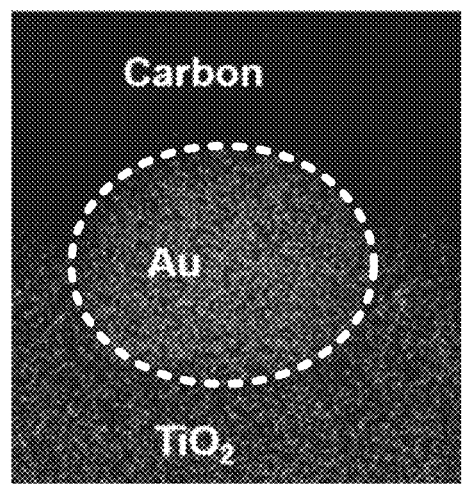
FIG. 3A
FIG. 3B

LIGHT ABSORBING DEVICE, MANUFACTURING METHOD THEREOF, AND PHOTOELECTRODE

TECHNICAL FIELD

The present invention relates to a light absorbing device and a method of manufacturing the same. The present invention also relates to a photoelectrode including the light absorbing device.

BACKGROUND ART

The probability of occurrence of interaction between light and matter is low. As such, various attempts have been made for causing interaction between light and matter. For example, a laser beam is used as light for the purpose of improving the sensitivity of biosensors, the resolution of a bioimaging image, and the like. In addition, highly densely arranged molecules, quantum dots and the like for light absorption, a thickened semiconductors for light absorption and the like are used for the purpose of improving the efficiency of the light energy conversion in a solar cell, artificial photosynthesis and the like. However, such methods may increase the raw material cost, and may reduction in the charge splitting efficiency due to increase in the thickness depending on the type of semiconductor.

Under such circumstances, as a method of increasing the probability of interaction between light and matter, metal nanostructures that exhibit localized surface plasmon resonance, micro resonators that confine light, micro-nanostructures such as photonic crystals have attracted attention. In particular, devices utilizing localized surface plasmon resonance, which can efficiency collect light with only two-dimensionally disposed metal nanostructures (metal nanoparticles), have been actively researched for the last decades. In recent years, it has been reported that, with a plurality of metal nanostructures disposed on an oxide semiconductor substrate, not only amplification of light, but also promotion of electron injection from the metal to the semiconductor can be achieved, and the effect of plasmons can be exerted also on chemical reactions such as the generation of hydrogen and synthesis of ammonia.

However, light cannot be completely collected with the metal nanostructures disposed on the surface of the semiconductor substrate. Usually, the amount of light that can be absorbed with the metal nanostructures disposed on the surface of the semiconductor substrate alone is approximately 50% at most. Moreover, in this case, only light of a specific wavelength that indicates plasmon resonance can be absorbed. It has also been proposed to increase the light absorption amount by forming the semiconductor into a three-dimensional shape such as a nanorod structure, a nanotube structure, and a honeycomb structure so as to support the metal nanostructure therein. This method, however, effectively utilizes only the light of a specific wavelength based on plasmon resonance, and cannot achieve absorption of light of a wide wavelength and increase of internal quantum yield although the apparent light-energy conversion efficiency is increased.

As a light absorbing device capable of absorbing light of a wide wavelength, a light absorbing device called a perfect absorber or a super absorber in which a dielectric layer is formed on a thin gold film and a plurality of metal nanostructures are disposed thereon or therein has been reported (see NPL 1). It is believed that in this light absorbing device, in the gold thin film located on the lower side under the metal nanostructures with the dielectric layer directly below the metal nanostructures therebetween, a plasmon having a phase opposite to that of the plasmon generated in the metal nanostructure is formed as a mirror image, and a strong near-field interaction called "image dipole interaction" occurs between the plasmon in the gold thin film and the plasmon in the metal nanostructure, thus achieving absorption of light of a wide wavelength (see NPL 2). Since this light absorbing device is intended only for light absorption, a metal nanostructure is placed on the dielectric layer or is completely embedded in the dielectric layer. In addition, since this light absorbing device is designed on the assumption of utilization of the image dipole interaction, it has been believed that the thickness of the dielectric layer is required to be reduced.

CITATION LIST

Non-Patent Literature

NPL 1
Mehdi Keshavarz Hedayati, et al., "Design of a Perfect Black Absorber at Visible Frequencies Using Plasmonic Metamaterials", Advanced Materials, Vol. 23, pp. 5410-5414

NPL 2
Na Liu, Martin Mesch, et al., "Infrared Perfect Absorber and Its Application As Plasmonic Sensor", Nano Letters, Vol. 10, pp. 2342-2348

SUMMARY OF INVENTION

Technical Problem

As described above, the known light absorbing devices described in NPL 1 and NPL 2 utilize image dipole interaction and therefore have structural limitations.

An object of the present invention is to provide a light absorbing device and a method of manufacturing the same which have less structural limitation and can efficiently collect light in a wide wavelength range. Another object of the present invention is to provide a photoelectrode including the light absorbing device.

Solution to Problem

A light absorbing device according to the embodiment of the present invention includes a light reflecting layer; a dielectric layer disposed on the light reflecting layer; and a plurality of metal nanostructures disposed on the dielectric layer, wherein each of the plurality of metal nano structures is partially embedded in the dielectric layer and is exposed to outside in a portion other than a portion embedded in the dielectric layer.

A photoelectrode according to the embodiment of the present invention includes the light absorbing device according to the embodiment of the present invention.

A method of manufacturing a light absorbing device according to the embodiment of the present invention includes preparing a metal layer as a light reflecting layer; forming a first dielectric layer on a surface of the metal layer; forming a plurality of metal nanostructures on the first dielectric layer; and forming a second dielectric layer on the first dielectric layer by an atomic layer deposition method such that the plurality of metal nanostructures are not completely buried.

Advantageous Effects of Invention

According to the present invention, it is possible to provide a light absorbing device and a photoelectrode which have less structural limitation and can efficiently collect light in a wide wavelength range.

BRIEF DESCRIPTION OF DRAWINGS

FIG. 3A is a scanning transmission electron microscope image showing a cross section in the vicinity of gold nanoparticles of a light absorbing device produced in Example 1, and FIG. 3B is an energy-dispersive X-ray analytical image in the area shown in FIG. 3A;

DESCRIPTION OF EMBODIMENTS

Hereinafter, embodiments of the present invention will be described in detail with reference to the accompanying drawings.

Configuration of Light Absorbing Device

Figure 1:
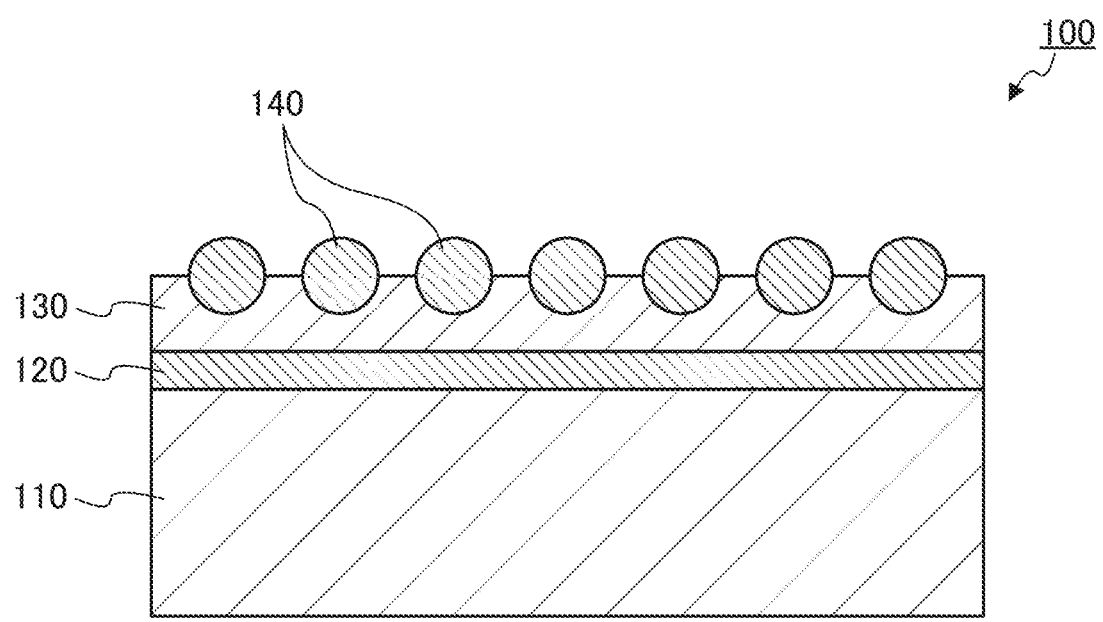
FIG. 1 is a schematic sectional view illustrating an exemplary configuration of a light absorbing device according to an embodiment of the present invention.

FIG. 1 is a schematic sectional view illustrating a configuration of light absorbing device 100 according to an embodiment of the present invention. As illustrated in FIG. 1, light absorbing device 100 includes supporting substrate 110, light reflecting layer 120, dielectric layer 130, and a plurality of metal nanostructures 140. Each component is described below.

Supporting substrate 110 supports light reflecting layer 120 and dielectric layer 130. Although supporting substrate 110 is not an essential component in terms of the function of light absorbing device 100, light absorbing device 100 preferably includes supporting substrate 110 from the viewpoint of maintaining the structure of light absorbing device 100. The material and shape of supporting substrate 110 are not particularly limited. From the viewpoint of maintaining the structure of light absorbing device 100, supporting substrate 110 preferably has a certain degree of mechanical strength. Examples of supporting substrate 110 include a glass plate, a ceramic plate, a metal plate and a resin plate.

Light reflecting layer 120 is disposed on supporting substrate 110 and configured to reflect light of a wavelength intended to be absorbed by light absorbing device 100. The configuration of light reflecting layer 120 is not particularly limited as long as it can exhibit the above functions, and may be appropriately selected in accordance with the wavelength of the light intended to be absorbed by light absorbing device 100. For example, light reflecting layer 120 is a layer made of metal (a metal thin film), a dielectric multilayer film, or the like. In addition, the metal plate may serve the functions of both light reflecting layer 120 and supporting substrate 110. When light reflecting layer 120 is made of metal, the type of the metal is not particularly limited. Examples of the metal constituting light reflecting layer 120 include gold, silver, copper, titanium and aluminum. The thickness of light reflecting layer 120 is not particularly limited as long as it can exhibit the above functions, and is 10 to 10000 nm, for example. Here, in the case where the metal plate serves the functions of both light reflecting layer 120 and supporting substrate 110, the metal plate (light reflecting layer 120) naturally has a thickness of 10000 nm or more. In addition, in the case where light absorbing device 100 is used as a photoelectrode, a metal plate or a metal layer may be used as light reflecting layer 120 such that the wiring from the outside is connected to light reflecting layer 120.

Dielectric layer 130 is a layer (dielectric thin film) made of a dielectric disposed on light reflecting layer 120. As described later, in light absorbing device 100 according to the present embodiment, light reflecting layer 120 and dielectric layer 130 function as a Fabry-Perot resonator when irradiated with light. Therefore, the front and back surfaces of dielectric layer 130 are preferably parallel to each other. The type of the dielectric constituting dielectric layer 130 is not particularly limited as long as it can function as a Fabry-Perot resonator. From the viewpoint of achieving a function as a Fabry-Perot resonator, the refractive index of the dielectric is preferably high. Specifically, the refractive index at the resonant wavelength of the Fabry-Perot resonator is preferably 1.4 or greater, more preferably 2.0 or greater for more efficient optical confinement. Examples of the dielectric constituting dielectric layer 130 include titanium oxide, strontium titanate, gallium nitride, zirconium oxide and nickel oxide. The thickness of dielectric layer 130 is also not particularly limited as long as it can function as a Fabry-Perot resonator when irradiated with light. For example, dielectric layer 130 has a thickness of approximately 20 to 1000 nm. The resonant wavelength of the Fabry-Perot resonator can be changed by adjusting the thickness of dielectric layer 130. Since light absorbing device 100 according to the present embodiment does not utilize the image dipole interaction, the thickness of dielectric layer 130 may be 20 nm or more, 50 nm or more, or 100 nm or more.

A plurality of metal nanostructures 140 generate localized surface plasmon resonance when irradiated with light. The plurality of metal nanostructures 140 are disposed in the surface of dielectric layer 130 such that they are partially embedded in dielectric layer 130. The portion not embedded in dielectric layer 130 in each metal nanostructure 140 is exposed to the outside. As a result, when other materials (solid, liquid or gas) are present on dielectric layer 130, the plurality of metal nanostructures 140 are in contact with the material. The shape, size and spacing of the metal nanostructures 140 are not particularly limited as long as localized surface plasmon resonance can be generated through light irradiation. The resonance wavelength of the localized surface plasmon resonance can be changed in the range from the visible region to the near infrared region by adjusting the shape, size or spacing of the metal nanostructures 140. Therefore, the shape, size, and spacing of the metal nanostructures 140 may be suitably selected such that localized surface plasmon resonance occurs at the wavelength of the light at which the absorption efficiency is desired to be increased. Examples of the shape of metal nanostructure 140 include a substantially spherical shape, a rod-like shape, a disk-like shape and a conical shape. In addition, the maximum length of the metal nanostructure 140 is approximately 5 to 1000 nm. The spacing of the metal nanostructures 140 is approximately 3 to 1000 nm. As described above, the surfaces of the plurality of metal nanostructures 140 are partially exposed to the outside. For example, 0.1 to 99.9% of the surface area of each metal nanostructure 140 is exposed to the outside. The proportion of the exposed surface area in each metal nanostructure 140 is preferably 90% or less from the viewpoint of efficiently performing electron transfer from the metal nanostructure 140 to the dielectric constituting dielectric layer 130, and is more preferably 60% or less from the viewpoint of forming an effective coupling between the Fabry-Perot resonator and the localized surface plasmon. The proportion of the exposed surface area of each metal nanostructure 140 is preferably 10% or more from the viewpoint of efficiently causing interaction with other substances (solid, liquid or gas) present on dielectric layer 130, or is more preferably 30% or more from the viewpoint of causing exchange of charges with the other substances.

In light absorbing device 100 according to the present embodiment, a portion of each metal nanostructure 140 is embedded in dielectric layer 130, and the remaining portion of each metal nanostructure 140 is exposed to the outside unlike a known light absorbing device in which a plurality of metal nanostructures are completely embedded in the dielectric layer and a known light absorbing device in which a plurality of metal nanostructures are disposed on the surface of the dielectric layer. While light absorbing device 100 according to the present embodiment may include a metal nanostructure 140 completely embedded in dielectric layer 130, or a metal nanostructure 140 disposed on dielectric layer 130 without being embedded in dielectric layer 130, it is preferable that 90% or more of the metal nanostructures 140 that are in contact with at least dielectric layer 130 be partially embedded in dielectric layer 130 and exposed to the outside in the portion other than the embedded portion. In addition, it is preferable that the proportion of the volume of the metal nanostructures 140 each of which is partially embedded in dielectric layer 130 and is exposed to the outside in the portion other than the embedded portion in the total volume of all metal nanostructures 140 that are in contact with dielectric layer 130 is 90% or more.

As described above, in light absorbing device 100 according to the present embodiment, the plurality of metal nanostructures 140 generate localized surface plasmon resonance when irradiated with light, and light reflecting layer 120 and dielectric layer 130 function as a Fabry-Perot resonator when irradiated with light. In addition, light absorbing device 100 according to the present embodiment is configured such that the resonance wavelength of the Fabry-Perot resonator falls within the range of the peak wavelength of the localized surface plasmon resonance ±the half width the peak. When the resonant wavelength of the Fabry-Perot resonator falls within the range of the peak wavelength of the localized surface plasmon resonance ±the half-width of the peak, strong coupling occurs between the localized surface plasmon and the Fabry-Perot resonator, and light absorbing device 100 can collect light in a wide wavelength range (see Examples). From the viewpoint of increasing the degree of strong coupling, it is preferable that the resonant wavelength of the localized surface plasmon resonance and the resonant wavelength of the Fabry-Perot resonator coincide with each other.

Method of Manufacturing Light Absorbing Device

A method of manufacturing light absorbing device 100 according to the present embodiment is not particularly limited. For example, light absorbing device 100 can be manufactured through the following steps (see FIGS. 2A to 2D).

Figure 2A:
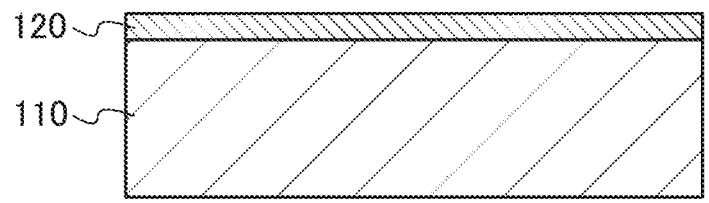
FIGS. 2A to 2D are schematic sectional views illustrating an exemplary method of manufacturing the light absorbing device according to the embodiment of the present invention.

First, a metal layer as light reflecting layer 120 is prepared (FIG. 2A). In the example illustrated in FIG. 2A, a metal layer as light reflecting layer 120 is formed on supporting substrate 110. The method of forming the metal layer is not particularly limited. Examples of the method of forming the metal layer include sputtering, vacuum evaporation, electrical reduction and ion plating. In addition, as light reflecting layer 120 (and supporting substrate 110), a metal plate may be prepared.

Figure 2B:
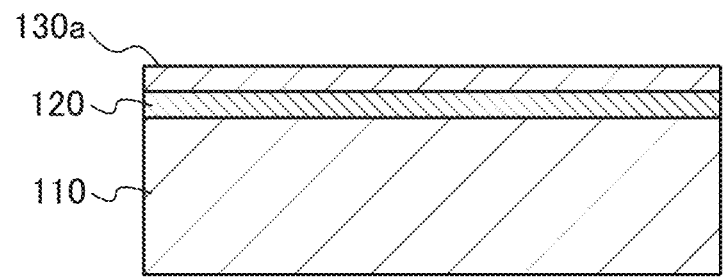

Next, first dielectric layer 130a is formed on the surface of the metal layer (light reflecting layer 120) (FIG. 2B). First dielectric layer 130a is a layer that serves as a part of dielectric layer 130. The method of forming first dielectric layer 130a is not particularly limited. Examples of the method of forming first dielectric layer 130a include atomic layer deposition, pulsed laser deposition, sputtering, solvothermal synthesis, spray pyrolysis, and molecular beam epitaxy. In the case where first dielectric layer 130a is formed by an atomic layer deposition method, it is preferable to perform a pretreatment in order to densely form first dielectric layer 130a on the surface of the metal layer (light reflecting layer 120). Examples of the pretreatment include a surface treatment of adding a hydroxyl group to the surface of the metal layer (light reflecting layer 120), and a treatment of forming another layer (e.g., a titanium thin film) on the surface of the metal layer (light reflecting layer 120). For example, the surface treatment may be performed using a compound (e.g., 2-mercaptoethanol) having a functional group (e.g., a thiol group) containing S or N at one end and a hydroxyl group at the other end as a binding site to the metal layer (light reflecting layer 120).

Figure 2C:
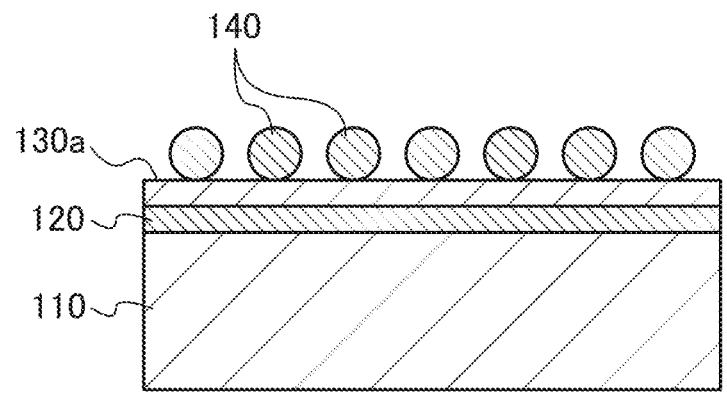

Next, a plurality of metal nanostructures 140 are formed on first dielectric layer 130a (FIG. 2C). At this time point, the plurality of metal nanostructures 140 need not be buried in first dielectric layer 130a. The method of forming the metal nano structure 140 is not particularly limited. For example, the plurality of metal nanostructures 140 can be simultaneously formed by forming a metal layer on first dielectric layer 130a and then annealing the metal layer into particles. In addition, the plurality of metal nanostructures 140 may be formed through photolithography.

Figure 2D:
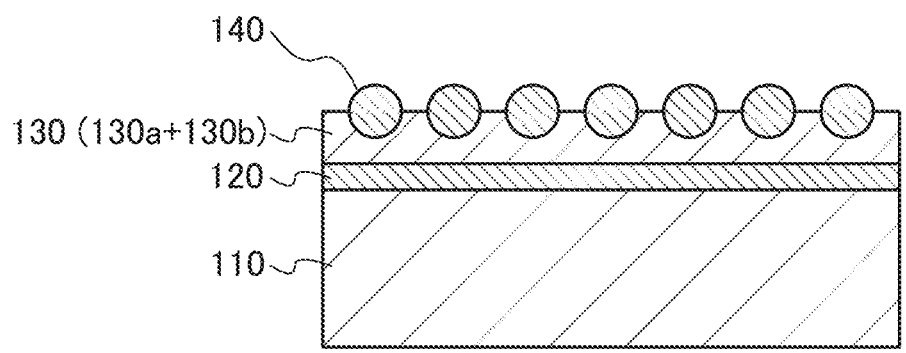

Finally, second dielectric layer 130b is formed on first dielectric layer 130a to form dielectric layer 130 (FIG. 2D). At this time, second dielectric layer 130b is formed between each metal nanostructure 140 such that the plurality of metal nanostructures 140 are not completely buried in dielectric layer 130. Specifically, in this step, second dielectric layer 130b is formed by an atomic layer deposition method without performing the surface treatment of adding a hydroxyl group. It is thus possible to suppress formation of second dielectric layer 130b on the plurality of metal nanostructures 140, and as a result, it is possible to prevent the plurality of metal nanostructures 140 from being completely buried in dielectric layer 130. The dielectric constituting first dielectric layer 130a and the dielectric constituting second dielectric layer 130b may or may not be the same.

Light absorbing device 100 can be manufactured through the above procedure. Light absorbing device 100 according to the present embodiment may be manufactured by other methods. For example, light absorbing device 100 may also be manufactured by selectively etching only second dielectric layer 130b by reactive dry etching after the plurality of metal nanostructures 140 have been completely embedded in second dielectric layer 130b. In this case, second dielectric layer 130b may be formed by a method other than atomic layer deposition methods (e.g., pulsed laser deposition, sputtering, solvothermal synthesis, spray pyrolysis and molecular beam epitaxy).

Effect

As described above, light absorbing device 100 according to the present embodiment achieves a light collecting structure responsive to a wide wavelength with a split spectrum through induction of strong coupling between the Fabry-Perot resonator and plasmons with the plurality of metal nanostructures 140 partially embedded in dielectric layer 130. In addition, in light absorbing device 100 according to the present embodiment, the image dipole interaction is not utilized unlike a known light absorbing device, and therefore the thickness of the dielectric layer is not particularly limited. Thus, the structure of light absorbing device 100 according to the present embodiment is less limited, and light can be efficiently collected in a wide wavelength range.

In addition, by utilizing a metal layer serving as light reflecting layer 120 as an electrode, light absorbing device 100 according to the present embodiment can also function as a photoelectrode. Since a plurality of metal nanostructures 140 are exposed to the outside, light absorbing device 100 (photoelectrode) according to the present embodiment can promote the interaction with other materials by utilizing the collected light. For example, in the case where water is present on dielectric layer 130 and the plurality of metal nanostructures 140, light absorbing device 100 (photoelectrode) according to the present embodiment can promote an oxidation reaction of water. In addition, in the case where a hole transport material is present on dielectric layer 130 and the plurality of metal nanostructures 140, light absorbing device 100 (photoelectrode) according to the present embodiment can promote photoelectric conversion. Thus, light absorbing device 100 (photoelectrode) according to the present embodiment can be applied to a plasmon solar cell, and a photocatalytic system (water splitting, ammonia synthesis, carbon dioxide fixation, organic oxidation-reduction reaction, and the like), for example.

EXAMPLES

The present invention is described in detail below with reference to Examples. The invention is not limited to the Examples.

Example 1

1. Production of Light Absorbing Device

A gold thin film (light reflecting layer) having a thickness of 100 nm was formed by sputtering on a glass plate as a supporting substrate. The glass plate on which the gold thin film was formed was immersed in an ethanol solution of 2-mercaptoethanol (50 mg/mL) for 24 hours, and a surface treatment of adding hydroxyl groups to the surface of the gold thin film was performed. On the surface-treated gold thin film, a thin film (first dielectric layer) of titanium oxide ($TiO_2$) having a predetermined thickness was formed using an atomic layer deposition apparatus. A gold thin film having a thickness of 3 nm was formed on a titanium oxide thin film by vacuum evaporation, followed by annealing of the gold thin film at 300° C. for 2 hours into particles, thereby forming a plurality of gold nanoparticles (metal nanostructures) each having a substantially spherical shape. The average particle size of the gold nanoparticles was 12 nm. Finally, a titanium oxide thin film (second dielectric layer) having a predetermined thickness was formed again using the atomic layer deposition apparatus. At this time, the titanium oxide thin film was formed without performing a surface treatment using 2-mercaptoethanol, and thus the titanium oxide thin film having a predetermined thickness was formed between the plurality of gold nanoparticles without forming the titanium oxide thin film on the plurality of gold nanoparticles. As a result, substantially all of the gold nanoparticles were partially buried in the titanium oxide thin film (partially exposed to the outside). The thickness of the titanium oxide thin film (the total thickness of the first dielectric layer and the second dielectric layer) was 19 nm, 21 nm, 23 nm, 25 nm, 28 nm, 30 nm, 32 nm, 35 nm, 44 nm, 136 nm, 160 nm, 168 nm, 178 nm, 192 nm or 211 nm. In addition, the depth of the buried portion of the gold nanoparticle was approximately 0 nm, approximately 3.5 nm, approximately 7 nm or approximately 14 nm.

FIG. 3A is a scanning transmission electron microscope image showing a cross section in the vicinity of the gold nanoparticles of a produced light absorbing device (depth of the buried portion of the gold nanoparticles: approximately 7 nm), and FIG. 3B is an energy-dispersive X-ray analytical image in the region illustrated in FIG. 3A. In FIG. 3B, which is converted to gray scale, the color of the area enclosed by the dashed line is red (indicating Au), the color of the area in the lower half outside the dashed line is green (indicating Ti), and the color of the area in the upper half outside the dashed line is black. These images show that the gold nanoparticles are partially embedded in the titanium oxide thin film, and that the remaining portions of the gold nanoparticles are not covered by the titanium oxide thin film.

Figure 4:
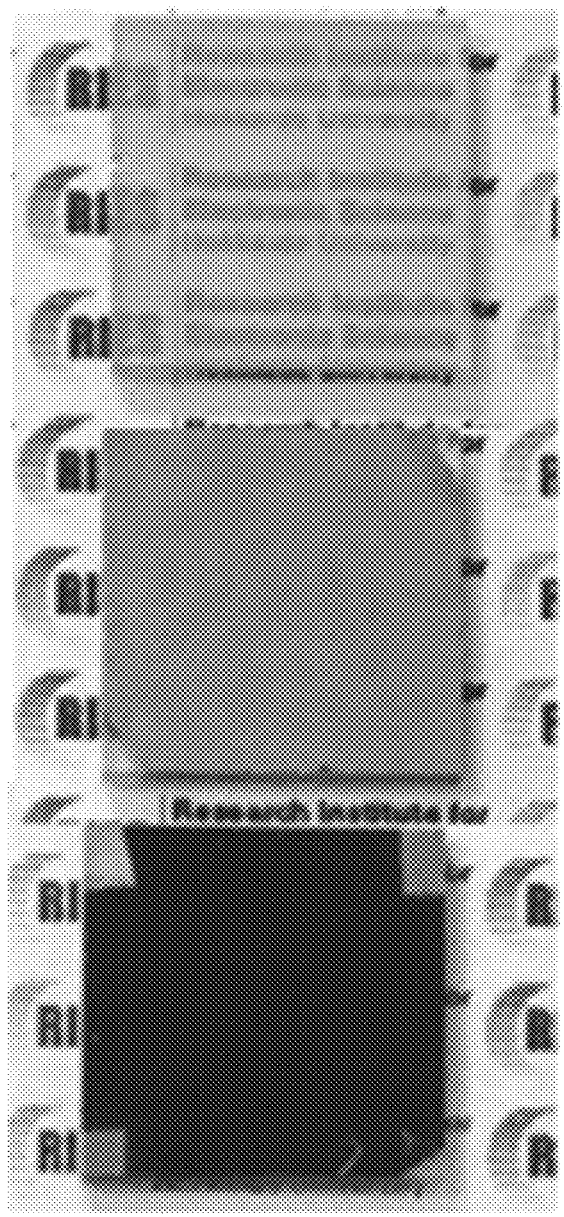
FIG. 4 is a photograph showing the light absorbing device produced in Example 1 and two light absorbing devices for comparison.

FIG. 4 is a photograph showing the produced light absorbing device and two light absorbing devices for comparison. In this photograph, the light absorbing device according to the embodiment of the present invention (the depth of the buried portion of the gold nanoparticles: approximately 7 nm) is illustrated in the lowermost part. A first light absorbing device for comparison illustrated in the uppermost part is obtained by forming a titanium oxide thin film (dielectric layer) on a glass substrate, and further forming a plurality of gold nanoparticles (metal nanostructures) thereon. In the first light absorbing device for comparison, no gold thin film (light reflecting layer) is formed, and the plurality of gold nanoparticles are not embedded in the titanium oxide thin film. A second light absorbing device for comparison illustrated in the middle part is obtained by sequentially forming a gold thin film (light reflecting layer) and a titanium oxide thin film (dielectric layer) on a glass substrate. In the second light absorbing device for comparison, a plurality of gold nanoparticles (metal nanostructures) are not formed. These three light absorbing devices are placed on paper on which the logo mark and the English name of the laboratory to which the inventors belong are printed.

As illustrated in the photograph of FIG. 4, the first light absorbing device for comparison (at the uppermost part) transmitted visible light. In addition, the second light absorbing device for comparison (middle) reflected visible light without reflecting the visible light because of the gold thin film (light reflecting layer). The second light absorbing device for comparison appeared orange. This indicates that light of some wavelengths in the visible range was absorbed by the gold thin film, while light of the other wavelengths was not absorbed. On the other hand, the light absorbing device according to the embodiment of the present invention (at the lowermost part) appeared black. This indicates that light of a wide wavelength in the visible range was absorbed.

2. Evaluation of Light Absorbing Device

Figure 5A:
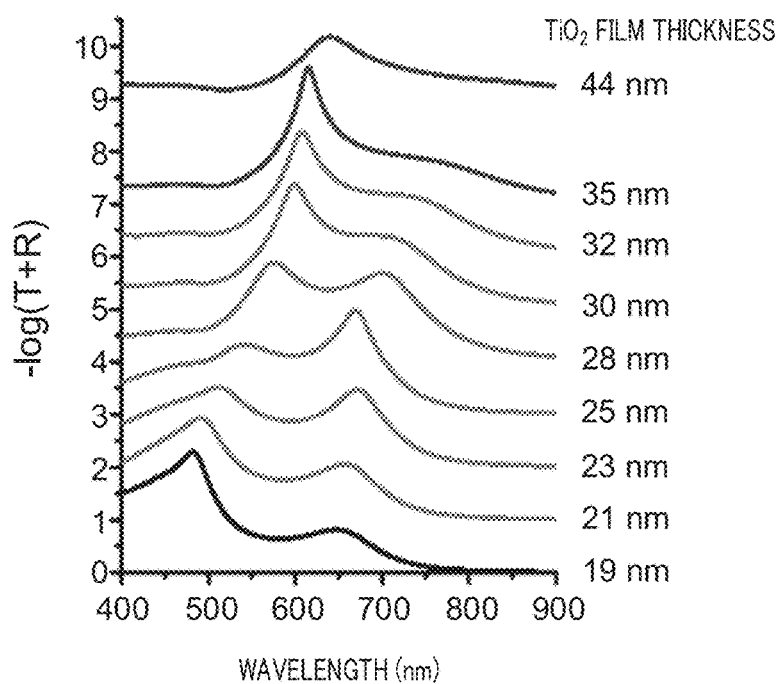
FIGS. 5A and 5B are graphs showing a relationship between the thickness and the absorption spectrum of a titanium oxide thin film for the light absorbing device produced in Example 1.
Figure 5B:
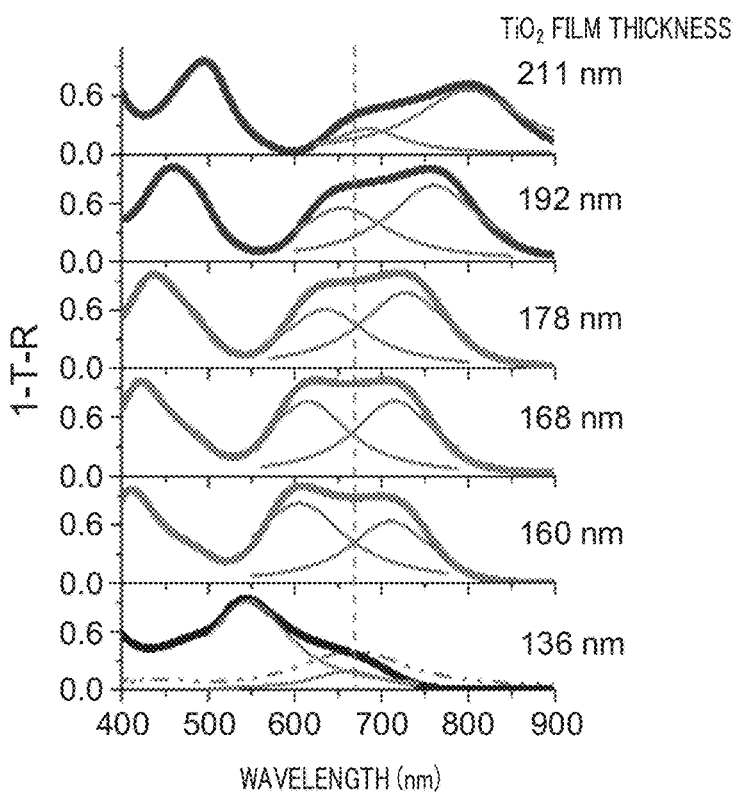

The absorption spectra of the produced light absorbing devices were measured. FIGS. 5A and 5B are graphs showing a relationship between a thickness of a titanium oxide thin film and the absorption spectrum. These graphs show absorption spectra of a light absorbing device in which the gold nanoparticles are buried in a titanium oxide thin film by approximately 7 nm. FIG. 5A shows an absorption spectra of light absorbing devices whose titanium oxide thin film has a thickness of 19 to 44 nm. The horizontal axis is the wavelength of light. The vertical axis is the value (logarithmic scale) of the absorption spectrum calculated from the value (T) of the transmission spectrum and the value (R) of the reflection spectrum. FIG. 5B shows absorption spectra of light absorbing devices whose titanium oxide thin film has a thickness of 136 to 211 nm. The horizontal axis is the wavelength of light. The vertical axis is the value (linear scale) of the absorption spectrum calculated from the value (T) of the transmission spectrum and the value (R) of the reflection spectrum.

Figure 6:
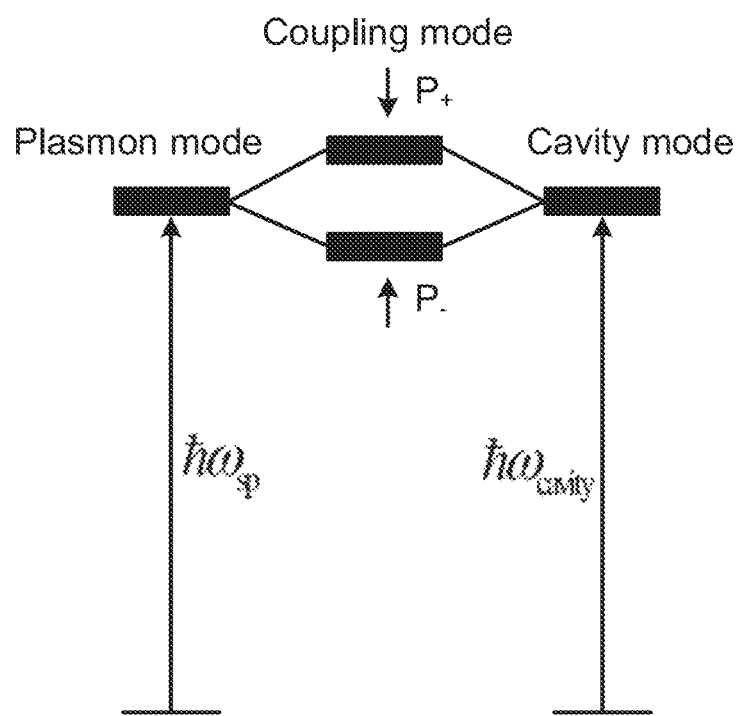
FIG. 6 is a schematic diagram showing formation of a hybrid level through strong coupling between a Fabry-Perot resonator and plasmons.

These graphs show that the absorption spectrum is split into two peaks in the light absorbing device whose titanium oxide thin film has a thickness of 28 nm and the light absorbing device having the thickness of 168 nm. As a result of a trial of spectral splitting in each spectrum shown in FIG. 5B, it was confirmed that the spectrum can be split into two spectra as indicated by a thin line in FIG. 5B. In the two light absorbing devices (gold nanoparticles having an average particle size of 12 nm are embedded in the titanium oxide thin film by approximately 7 nm), the resonant wavelength corresponding to $\frac{1}{4}n$ or $\frac{3}{4}n$ (n is the refractive index of titanium oxide) of the Fabry-Perot resonator composed of the gold thin film, the titanium oxide thin film and the gold nanoparticles coincides with 650 nm, which is the plasmon resonance wavelength of the gold nanoparticles (for exudation of light from the resonator, the actual film thickness is thinner than this). This suggests a formation of a state where the resonant wavelength of the Fabry-Perot resonator overlaps the localized surface plasmon resonance wavelength of the gold nanoparticles, thus exchanging energy with a certain relationship between the phases of the two oscillators through the electromagnetic field interaction. This state can take two states: a state of oscillation with the phases aligned in the same direction (bonding property), and a state of oscillation with the phases in opposite directions (antibonding property). This is similar to formation of a hybrid state in covalent bond in which the molecular orbital is split into two levels, the bonding property and the anti-bonding property. This means that a phenomenon called strong coupling occurred between the Fabry-Perot resonator and plasmons was observed for the first time. Thus, with the Fabry-Perot resonator corresponding to $\frac{1}{4}n$ or $\frac{3}{4}n$ exhibiting strong coupling with localized surface plasmons of partially embedded gold nanoparticles, a hybrid level is formed as illustrated in the schematic diagram of FIG. 6 (in FIG. 6, $P_+$ is an upper polariton and $P_-$ is a lower polariton). As a result, as illustrated in FIGS. 5A and 5B, it is recognized that in a light absorbing device whose titanium oxide thin film has a thickness of 168 nm and in a light absorbing device whose titanium oxide thin film has a thickness of 28 nm, the absorption spectrum is split into two peaks such that light of a wide wavelength can be collected.

Figure 7A:
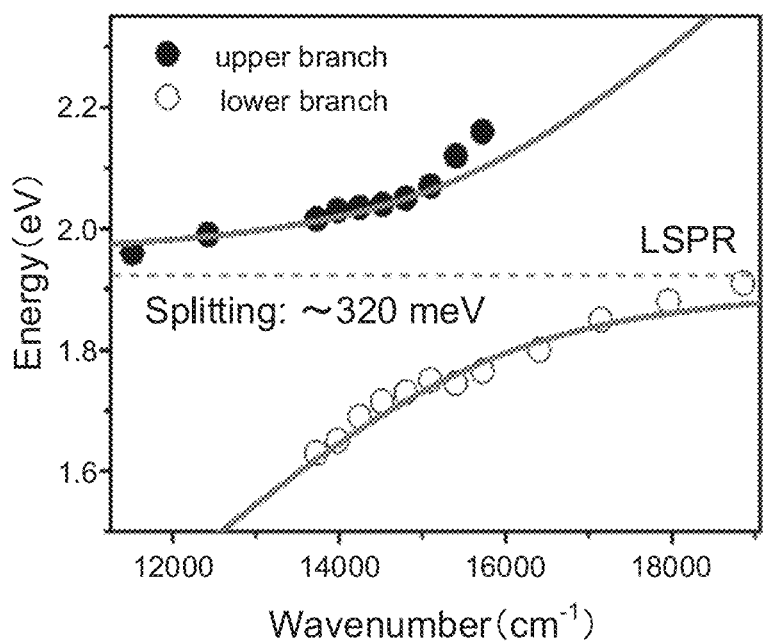
FIGS. 7A and 7B are graphs showing dispersion curves plotting an energy split by strong coupling between the Fabry-Perot resonator and the plasmons with respect to a resonant wavenumber of an original resonator.
Figure 7B:
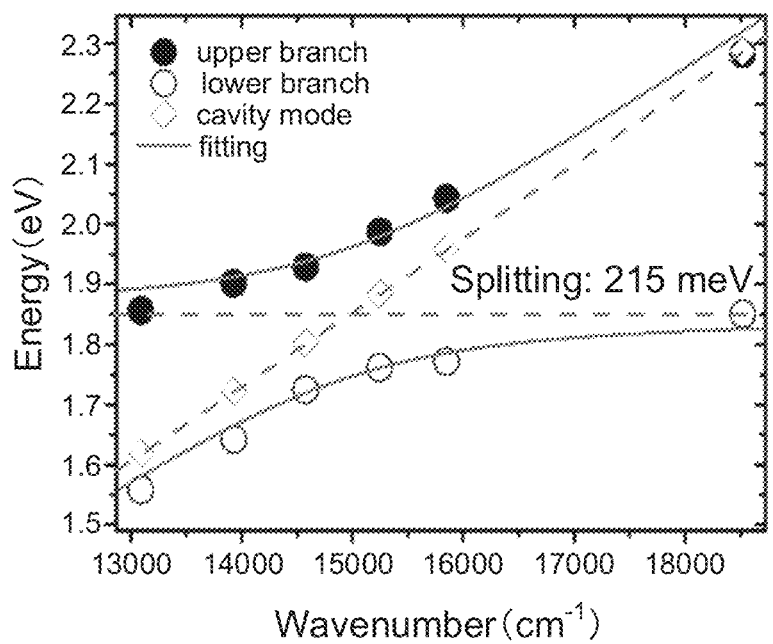

FIG. 7A is a graph showing a dispersion curve plotting the energy split by strong coupling of plasmons and the Fabry-Perot resonator corresponding to $\frac{1}{4}n$ with respect to the resonant wavenumber of the original resonator, and FIG. 7B is a graph showing a dispersion curve plotting the energy split by strong coupling of plasmons and the Fabry-Perot resonator corresponding to $\frac{3}{4}n$ with respect to the resonant wavenumber of the original resonator. These graphs show that in both the Fabry-Perot resonator corresponding to $\frac{1}{4}n$ and the Fabry-Perot resonator corresponding to $\frac{3}{4}n$, the dispersion curves plotting the energy of the split peaks with respect to the resonant wavenumber of the original Fabry-Perot resonator exhibit an anti-cross behavior peculiar to strong coupling, and fitting can be performed with a coupled oscillator model. This supports that the light absorbing device according to the embodiment of the present invention exhibits strong coupling.

Figure 8A:
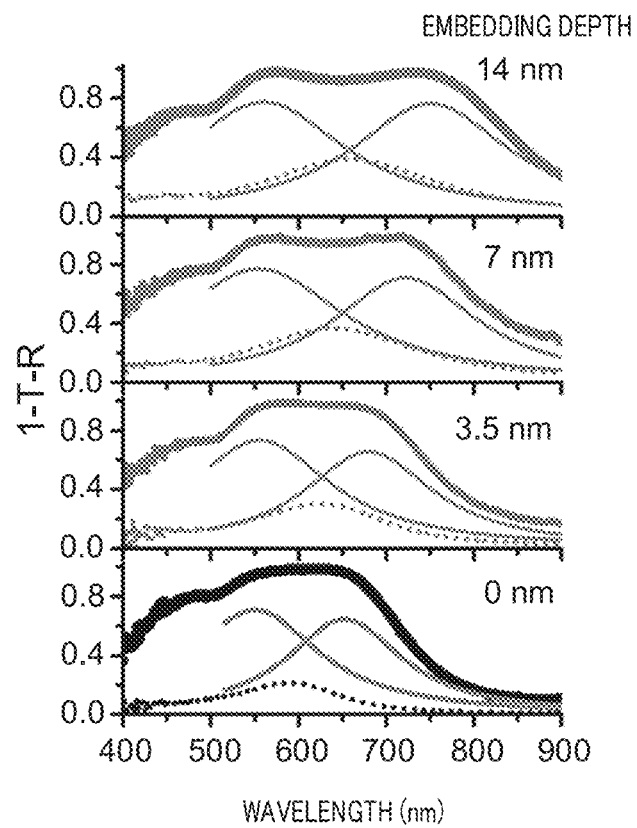
FIG. 8A is a graph showing a relationship between the embedding depth of gold nanoparticles and an absorption spectrum.
Figure 8B:
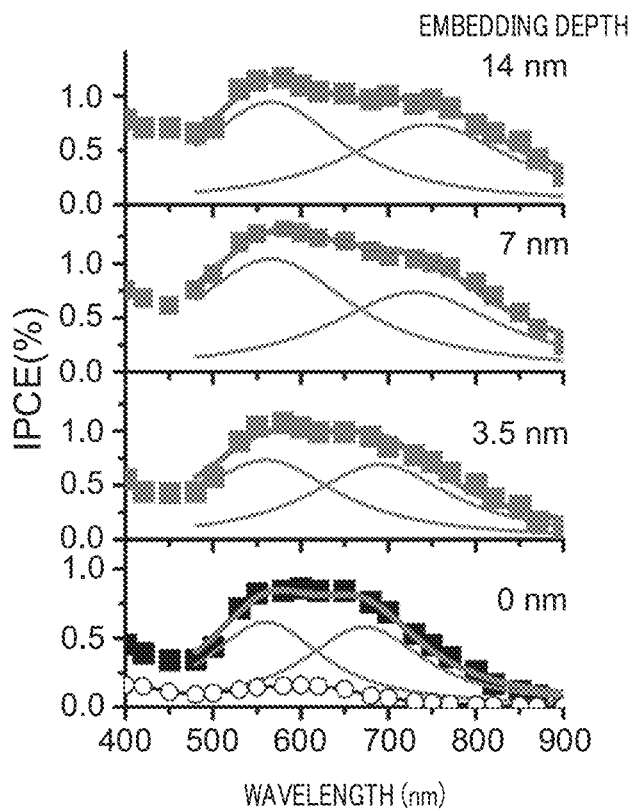
FIG. 8B is a graph showing a relationship between the embedding depth of the gold nanoparticles and the photoelectric conversion efficiency of a photoelectrode.

FIG. 8A is a graph showing a relationship between the embedding depth of the gold nanoparticles and the absorption spectrum, and FIG. 8B is a graph showing a relationship between the embedding depth of the gold nanoparticles and the photoelectric conversion efficiency of the photoelectrode. These graphs show the absorption spectrum and the photoelectric conversion efficiency in a light absorbing device (photoelectrode) with a titanium oxide thin film having a thickness of 28 nm. The photoelectric conversion efficiency (external quantum yield) of the photoelectrode was measured by performing photoelectrochemical measurements of a three-electrode type with the light absorbing device (using a gold thin film as an electrode) immersed in an electrolyte aqueous solution (0.1 mol/dm$^3$ KOH aqueous solution). In FIG. 8A, the horizontal axis is the wavelength of light, and the vertical axis is the value (linear scale) of the absorption spectrum calculated from the value (T) of the transmission spectrum and the value (R) of the reflection spectrum. In FIG. 8B, the horizontal axis is the wavelength of light, and the vertical axis is the photoelectric conversion efficiency of the photoelectrode (external quantum yield).

The graph of FIG. 8A shows that the greater the embedding depth of gold nanoparticles, the wider the wavelength range of the light that can be absorbed. Conceivably, the reason for this is that the strong coupling is induced by the gold nanoparticles partially embedded in the titanium oxide thin film. This result shows that in order to construct a light absorbing device responsive to light in a wide wavelength range of the visible range, it is preferable to partially embed the gold nanoparticles in the titanium oxide thin film.

In addition, the action spectrum of the photoelectric conversion efficiency (external quantum yield) of the photoelectrode illustrated in FIG. 8B almost matched the absorption spectrum illustrated in FIG. 8A. That is, it was confirmed that the greater the embedding depth of the gold nanoparticles, the wider the wavelength range of the light for performing photoelectric conversion using water as an electron source. Thus, the light absorbing device and the photoelectrode according to the embodiment of the present invention provide the light absorption efficiency and the response wavelength region completely different from those of the known light absorbing device and photoelectrode in which gold nanoparticles are not embedded.

On the other hand, the graphs of FIGS. 8A and 8B show that in the photoelectrode in which gold nanoparticles are embedded by approximately 14 nm, the photoelectric conversion efficiency is significantly reduced although light of a wide wavelength range can be absorbed (the energy of the strong coupling is high). That is, the photoelectric conversion efficiency of the photoelectrode in which gold nanoparticles are embedded by approximately 7 nm was higher than that of the photoelectrode in which gold nanoparticles are embedded by approximately 14 nm. Conceivably, the reason for this is that when the gold nanoparticles having an average particle size of 12 nm are embedded in the titanium oxide thin film by approximately 14 nm, the majority of the gold nanoparticles are embedded in the titanium oxide thin film, and consequently the area of the three-phase interface (gold nanoparticles/titanium oxide thin film/water) where the oxidation reaction of water is induced is reduced. This means that the known light absorbing device in which the gold nanostructure is completely embedded in the dielectric layer cannot provide a three-phase interface, and therefore cannot be applied to plasmon-induced photoelectric conversion and artificial photosynthesis.

Further, FIGS. 8A and 8B show that the current value becomes larger as the embedding depth of the gold nanoparticles increases, although the absorbing efficiency does not greatly change even when the embedding depth of the gold nanoparticles changes. This suggests that, in the photoelectrode according to the embodiment of the present invention, not only the external quantum yield but also the internal quantum yield (the number of generated electrons or molecules with respect to the number of absorbed photons) is also increased.

Figure 9A:
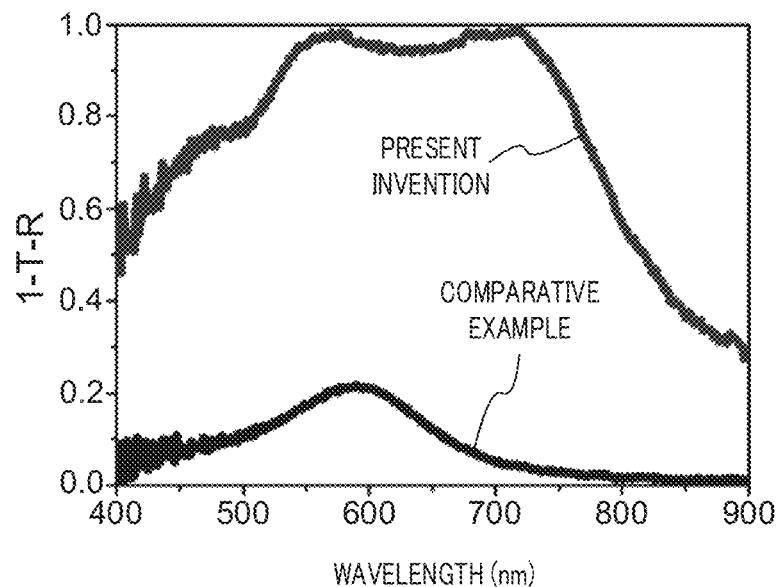
FIG. 9A is a graph showing absorption spectra of the light absorbing device according to the embodiment of the present invention and a light absorbing device according to a comparative example.
Figure 9B:
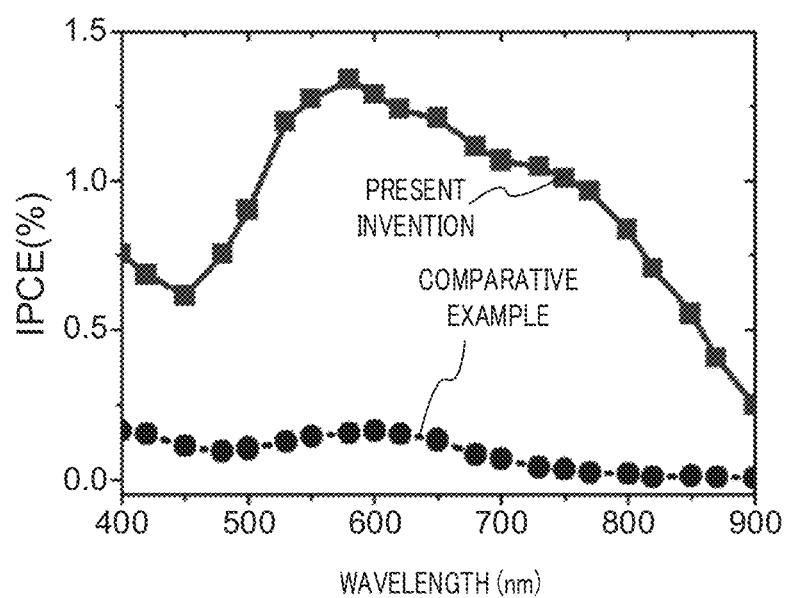
FIG. 9B is a graph showing action spectra of the photoelectrode according to the embodiment of the present invention and a photoelectrode according to a comparative example.

FIG. 9A is a graph showing absorption spectra of the light absorbing device according to the embodiment of the present invention and a light absorbing device according to a comparative example, and FIG. 9B is a graph showing action spectra of the photoelectrode according to the embodiment of the present invention and the photoelectrode according to the comparative example. As the light absorbing device (photoelectrode) according to the embodiment of the present invention, a light absorbing device in which gold nanoparticles are embedded in the titanium oxide thin film by approximately 7 nm was used. As the light absorbing device (photoelectrode) according to the comparative example, a known light absorbing device in which a plurality of gold nanoparticles are formed on the titanium oxide thin film (the above-described first light absorbing device for comparison) was used. In FIG. 9A, the horizontal axis is the wavelength of light, and the vertical axis is the value (linear scale) of the absorption spectrum calculated from the value (T) of the transmission spectrum and the value (R) of the reflection spectrum. In FIG. 9B, the horizontal axis is the wavelength of light, and the vertical axis is the photoelectric conversion efficiency of the photoelectrode (external quantum yield).

The graph of FIG. 9A shows that the absorption efficiency of the light absorbing device according to the embodiment of the present invention is significantly higher than the absorption efficiency of the comparative light absorbing device. When integrated in the range of wavelengths 400 nm to 900 nm, the number of absorbed photons in the light absorbing device according to the embodiment of the present invention was 9 times greater than that in the light absorbing device according to the comparative example.

In addition, the graph of FIG. 9B shows that the external quantum yield of the photoelectrode according to the present embodiment is significantly larger than the external quantum yield of the photoelectrode according to the comparative example. Compared at the wavelength of the absorption maximum, the external quantum yield of the photoelectrode according to the embodiment of the present invention was 8 times greater than that of the photoelectrode according to the comparative example. In addition, when integrated in the range of wavelengths 400 nm to 900 nm, the external quantum yield of the photoelectrode according to the embodiment of the present invention was 11 times greater than that of the photoelectrode according to the comparative example.

3. Production and Evaluation of Visible Light Water Splitting Apparatus

Figure 10A:
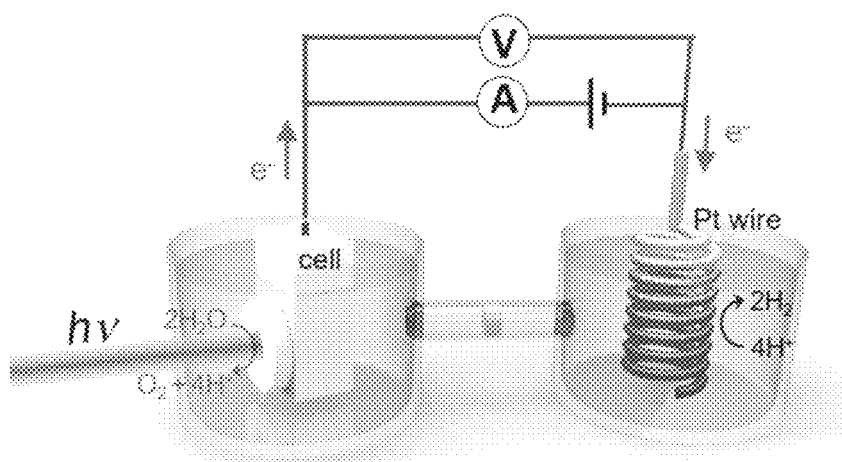
FIG. 10A is a schematic diagram illustrating a configuration of a visible light water splitting apparatus.

A visible light water splitting apparatus was produced using a produced light absorbing device (photoelectrode) as an anode, and a platinum electrode as a cathode. As the light absorbing device (photoelectrode), a light absorbing device (photoelectrode) in which gold nanoparticles having an average particle size of approximately 12 nm are buried by approximately 7 nm in a titanium oxide thin film having a thickness of 28 nm was used. FIG. 10A is a schematic diagram illustrating a configuration of the visible light water splitting apparatus. As electrolyte solution, 0.1 mol/dm$^3$ KOH aqueous solution was used. The anode (photoelectrode) was irradiated with xenon light (550 mW per cm$^2$) having a wavelength of 400 nm or more, and the amount of the oxygen generated at the anode and the amount of generated hydrogen at the cathode were measured.

Figure 10B:
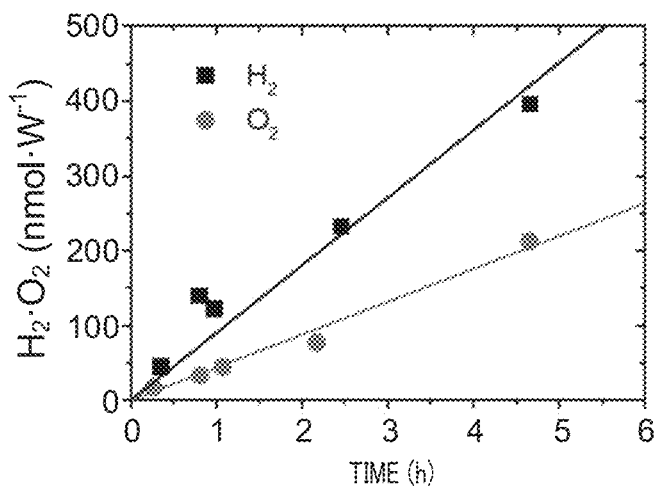
FIG. 10B is a graph showing a relationship between the light irradiation time and the amount of generated hydrogen.

FIG. 10B is a graph showing a relationship between the irradiation time of light, the amount of generated oxygen, and the amount of generated hydrogen. This graph shows that the amounts of generated oxygen and hydrogen indicate a linear response to the irradiation time of light. In addition, the ratio of the amounts of generated oxygen and hydrogen is 1:2, which means that the visible light water splitting stoichiometrically proceeds.

Figure 10C:
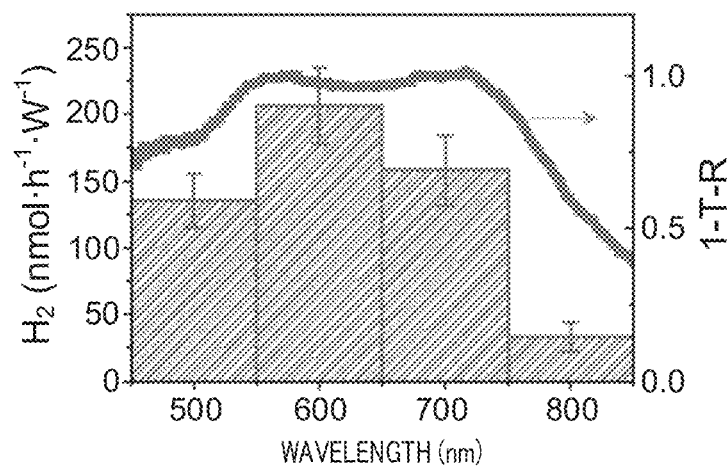
FIG. 10C is a graph showing a relationship between the wavelength of irradiated light and the amount of generated hydrogen, and an absorption spectrum of the photoelectrode.

FIG. 10C is a graph showing a relationship between the wavelength of irradiated light and the amount of generated hydrogen, and an absorption spectrum of the photoelectrode. In this measurement, an optical filter was used to limit the wavelength range of light for irradiation of the photoelectrode. This graph shows that the amount of generated hydrogen in each wavelength region sufficiently match the absorption spectrum of the photoelectrode.

Example 2

1. Production of Light Absorbing Device (Photoelectrode)

A gold thin film (light reflecting layer) having a thickness of 50 nm was formed on a glass plate as a supporting substrate by sputtering, and thereafter a titanium thin film having a thickness of 2 nm was formed. Thereafter, a titanium oxide ($TiO_2$) thin film (first dielectric layer) having a thickness of 25 nm was formed using an atomic layer deposition apparatus. A gold thin film having a thickness of 3 nm was formed by vacuum evaporation on the titanium oxide thin film, and the gold thin film was annealed at 300° C. for 2 hours into particles so as to form a plurality of gold nanoparticles (metal nanostructures) each having a substantially spherical shape. The average particle size of the gold nanoparticles was 12 nm. Thereafter, a thin nickel oxide film (second dielectric layer) having a thickness of 5 nm was formed using a pulsed laser deposition method. At this time, the nickel oxide thin film was formed between the plurality of gold nanoparticles without forming the nickel oxide thin film on the plurality of gold nanoparticles. As a result, substantially all of the gold nanoparticles were partially buried in the nickel oxide thin film (partially exposed to the outside). Then, a nickel oxide film (hole transport material layer) having a thickness of 39 nm was formed by a pulsed laser deposition method, and thereafter a gold thin film (cathode) having a thickness of 4 nm was formed by sputtering.

2. Evaluation of Light Absorbing Device (Photoelectrode)

Figure 11A:
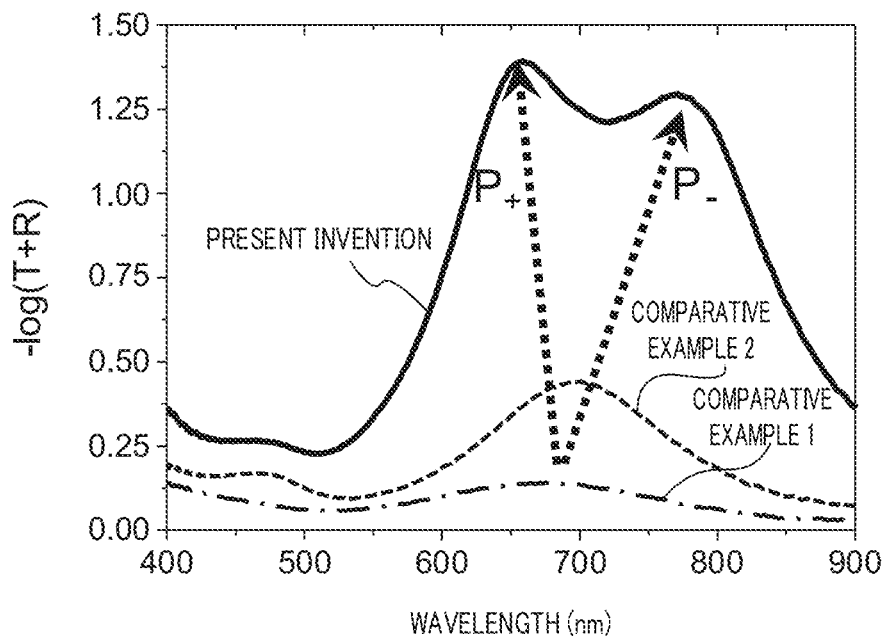
FIG. 11A is a graph showing absorption spectra of the light absorbing device (photoelectrode) according to the embodiment of the present invention and the light absorbing device (photoelectrode) according to the comparative example.

FIG. 11A is a graph showing absorption spectra of the produced light absorbing device (photoelectrode) according to the embodiment of the present invention and light absorbing devices (photoelectrode) according to the comparative examples. As the light absorbing devices according to the comparative examples, a third light absorbing device for comparison in which the gold thin film (light reflecting layer) is omitted (which is referred to as comparative example 1 in FIG. 11A), and a fourth light absorbing device for comparison in which a plurality of gold nanoparticles (metal nanostructures) are omitted (which is referred to as comparative example 2 in FIG. 11A) were used. In FIG. 11A, the horizontal axis is the wavelength of light, and the vertical axis is the value (logarithmic scale) of the absorption spectrum calculated from the value (T) of the transmission spectrum and the value (R) of the reflection spectrum. This graph shows that the absorption spectrum of the produced light absorbing device (photoelectrode) according to the embodiment of the present invention is divided into two peaks. Therefore, it is recognized that also with this light absorbing device (photoelectrode), strong coupling occurred between the Fabry-Perot resonator and plasmons and the absorption spectrum was split into two peaks, thus allowing collection of light of a wide wavelength as in the light absorbing device produced in Example 1.

Figure 11B:
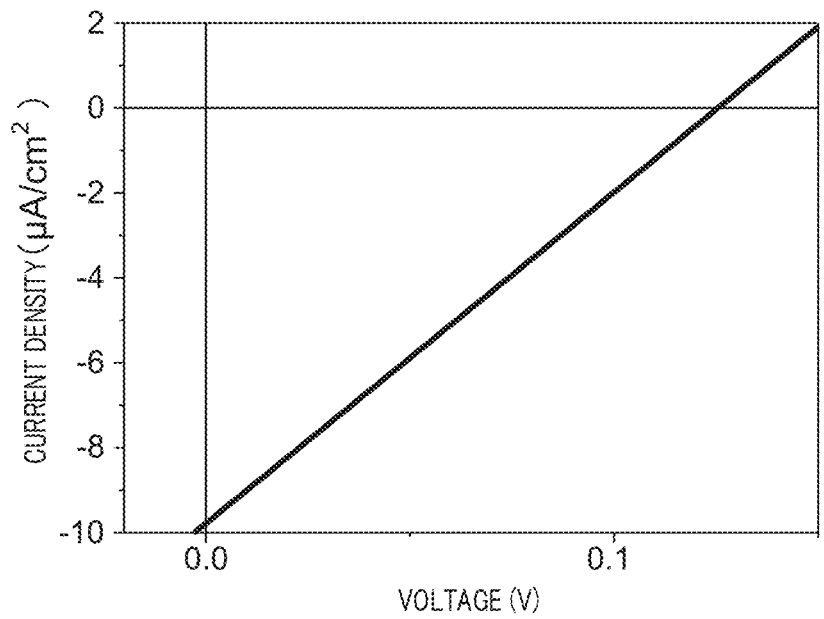
FIG. 11B is a graph showing photoelectric conversion characteristics of the light absorbing device (photoelectrode) according to the embodiment of the present invention.

FIG. 11B is a graph showing photoelectric conversion characteristics (current-voltage characteristics) of the produced light absorbing device (photoelectrode) according to the embodiment of the present invention. The photoelectric conversion characteristics of the light absorbing device (photoelectrode) were measured by performing photoelectric measurement using the gold thin film (light reflecting layer) on the glass plate side as an anode and the other gold thin film as a cathode such that the photoelectrode is irradiated with light from the cathode side. A solar simulator capable of irradiating pseudo-sunlight was used as the light source, and light having a wavelength of 450 nm or less was blocked using a filter. In FIG. 11B, the horizontal axis is the voltage, and the vertical axis is the current density. This graph shows that the light absorbing device (photoelectrode) according to the embodiment of the present invention can function as a photoelectric conversion device when irradiated with light of a wavelength longer than 450 nm. The absorption spectrum of FIG. 11A shows that the light absorbing device (photoelectrode) according to the embodiment of the present invention can generate power by absorbing visible light.

These results show that an all-solid-state photoelectric conversion device can be constructed using the light absorbing device (photoelectrode) according to the embodiment of the present invention. That is, the light absorbing device (photoelectrode) according to the embodiment of the present invention can be applied to a high absorption solar cell.

Example 3

1. Production of Light Absorbing Device

As a supporting substrate, a glass plate having a plurality of through holes disposed in a matrix at intervals of 100 μm was prepared. The shape of each through hole is a square prism whose bottom surface is square with each side of 100 μm. On this glass plate, a gold thin film having a thickness of 50 nm (light reflecting layer) was formed using a vacuum evaporation apparatus. The glass plate on which the gold thin film was formed was immersed in an ethanol solution of 2-mercaptoethanol (50 mg/mL) for 24 hours, and a surface treatment was performed to add hydroxyl groups to the surface of the gold thin film. A titanium oxide ($TiO_2$) thin film (first dielectric layer) having a thickness of 28 nm was formed on the surface-treated gold thin film using an atomic layer deposition apparatus. A gold thin film having a thickness of 3 nm was formed by vacuum evaporation on a titanium oxide thin film, and this gold thin film was annealed at 300° C. for 2 hours into particles so as to form a plurality of gold nanoparticles (metal nanostructures) each having a substantially spherical shape. The average particle size of the gold nanoparticles was 13 nm. Finally, a titanium oxide thin film (second dielectric layer) having a thickness of 7 nm was formed again using the atomic layer deposition apparatus. At this time, the titanium oxide thin film of a predetermined thickness was formed between the plurality of gold nanoparticles without forming the titanium oxide thin film on the plurality of gold nanoparticles. As a result, substantially all of the gold nanoparticles were partially buried in the titanium oxide thin film (partially exposed to the outside).

Figure 12A:
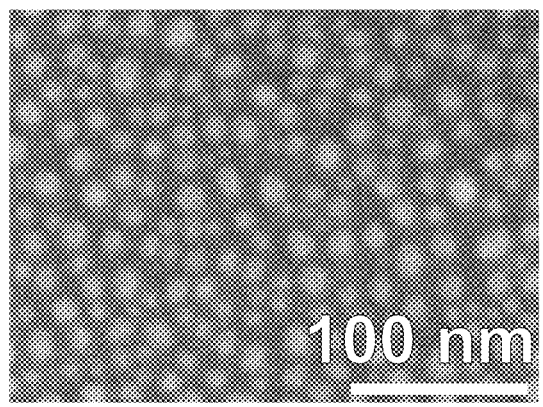
FIG. 12A is a scanning transmission electron microscope image showing an upper surface of a light absorbing device produced in Example 3.
Figure 12B:
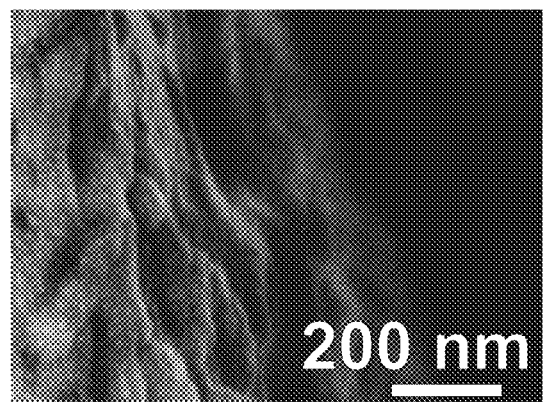
FIG. 12B is a scanning transmission electron microscope image showing a cross section of a side surface of the recess of the light absorbing device prepared in Example 3.

FIG. 12A is a scanning transmission electron microscope image showing an upper surface of the produced light absorbing device, and FIG. 12B is a scanning transmission electron microscope image showing a cross section of a side surface of the through hole of the produced light absorbing device. These images show that the gold nanoparticles are uniformly scattered not only in the upper surface but also in the through hole of the light absorbing device.

2. Evaluation of Light Absorbing Device

Figure 12C:
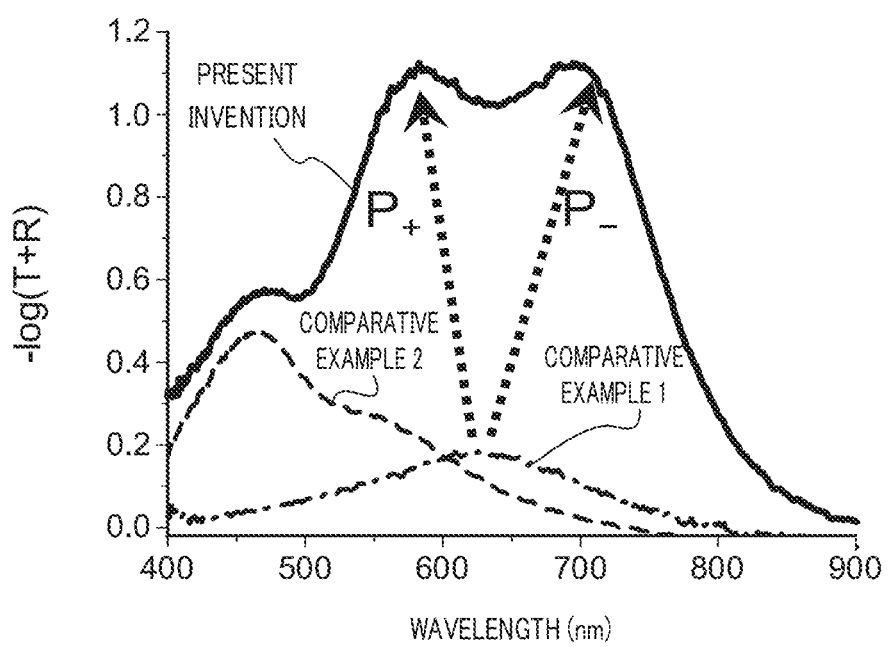
FIG. 12C is a graph showing absorption spectra of the light absorbing device according to the embodiment of the present invention and the light absorbing device according to the comparative example.

FIG. 12C is a graph showing absorption spectra of the produced light absorbing device according to the embodiment of the present invention, and light absorbing devices according to comparative examples. As the light absorbing devices according to the comparative examples, a fifth light absorbing device for comparison in which the gold thin film (light reflecting layer) is omitted (which is referred to as comparative example 1 in FIG. 12C), and a sixth light absorbing device for comparison in which a plurality of gold nanoparticles (metal nanostructure) are omitted (which is referred to as comparative example 2 in FIG. 12C) were used. In FIG. 12C, the horizontal axis is the wavelength of light, and the vertical axis is the value of the absorption spectrum calculated from the value (T) of the transmission spectrum and the value (R) of the reflection spectrum (logarithmic scale). This graph shows that the absorption spectrum of the produced light absorbing device according to the embodiment of the present invention is divided into two peaks. Therefore, also in this light absorbing device, strong coupling occurred between the Fabry-Perot resonator and the plasmons and the absorption spectrum was split into two peaks, thus allowing collection of light of a wide wavelength as in the light absorbing device prepared in Example 1.

In addition, since the light absorbing device includes a large number of through holes, the reaction surface area is large, and the substance can be moved through the through holes. Further, the angular dependence of the Fabry-Perot resonator is reduced in this light absorbing device. That is, the light absorbing device according to the embodiment of the present invention can be applied to a high-efficiency photochemical reaction device.

Reference Example 1

1. Production of Light Absorbing Device

Figure 13A:
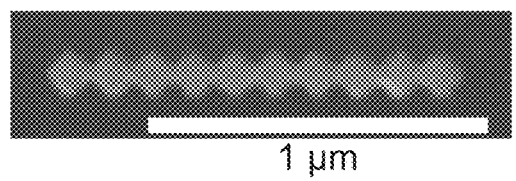
FIG. 13A is a scanning transmission electron microscope image showing a gold nanochain structure.

A gold thin film having a thickness of 50 nm was formed on a glass plate as a supporting substrate by sputtering (light reflecting layer), and thereafter a titanium thin film having a thickness of 2 nm was formed. Thereafter, a titanium oxide ($TiO_2$) thin film having a thickness of 25 nm (first dielectric layer) was formed using an atomic layer deposition apparatus. A gold nanostructure (metal nanostructure) of a predetermined shape having a thickness of 30 nm was formed on the titanium oxide thin film by an electron beam lithography-lift-off method. The gold nanostructure has a chain structure in which gold nanoparticles each having a square prism shape are connected in the diagonal direction of the bottom surface, and is therefore also referred to as a "gold nanochain structure" in the following description. The length of the gold nanochain structure in the long side direction (diagonal direction) was 0.52 μm, 0.75 μm, 1.45 μm or 2.38 μm. FIG. 13A is a scanning transmission electron microscope image showing a gold nanochain structure having a length of 1.22 μm in the long side direction.

2. Evaluation of Light Absorbing Device

Figure 13B:
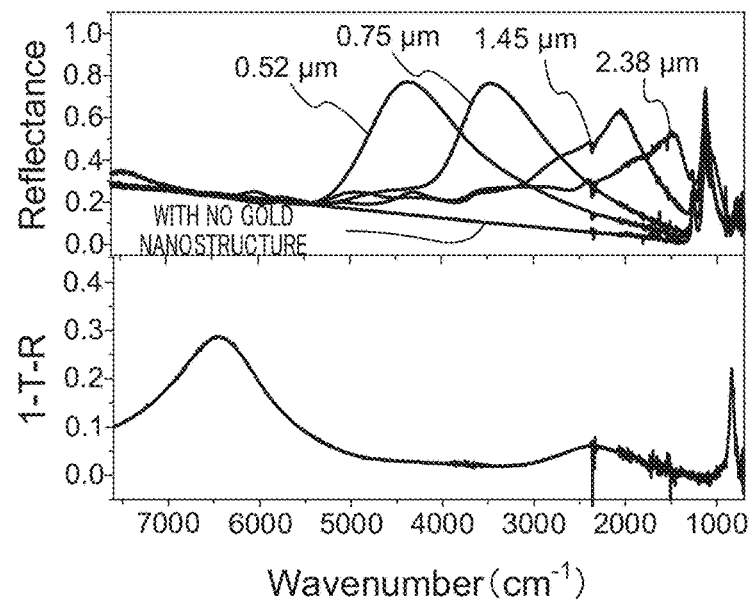
FIG. 13B is a graph showing reflection spectra of gold nanochain structures and a absorption spectrum of a Fabry-Perot resonator.

The graph on the upper side in FIG. 13B shows reflection spectra of gold nanochain structures each formed over a titanium oxide thin film. This graph shows reflection spectra of a non-nanochain structure, a gold nanochain structure having a length of 0.52 μm, a gold nanochain structure having a length of 0.75 μm, a gold nanochain structure having a length of 1.45 μm, and a gold nanochain structure having a length of 2.38 μm. In this graph, the horizontal axis is the wavenumber of light, and the vertical axis is the reflectance (linear scale) indicating the plasmon resonance. The graph shows that the plasmon resonance band of the gold nanochain structure is observed in the infrared region, and that the longer the gold nanochain structure, the smaller the wavenumber of the plasmon resonance band.

Figure 13C:
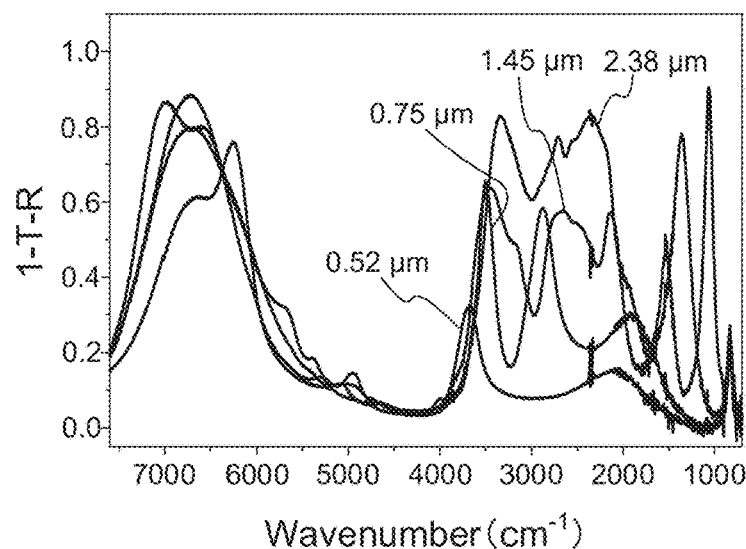
FIG. 13C is a graph showing absorption spectra of the light absorbing device.

The graph on the lower side in FIG. 13B shows an absorption spectrum of a Fabry-Perot resonator including a gold thin film and a titanium oxide thin film having a thickness of 450 nm. In addition, FIG. 13C is a graph showing absorption spectra of the produced light absorbing device. The numbers in the graph of FIG. 13C indicate lengths of the gold nanochain structures. In these graphs, the horizontal axis is the wavenumber of light, and the vertical axis is the value (linear scale) of the absorption spectrum calculated from the value (T) of the transmission spectrum and the value (R) of the reflection spectrum. The two graphs of FIG. 13B and the graph of FIG. 13C show that the light absorbing device exhibits strong absorption and modulation of the spectrum when the plasmon resonance band and the Fabry-Perot resonance mode overlap even in the infrared wavelength region.

While the gold nanostructure is not embedded in the second dielectric layer in the light absorbing device produced in this reference example, the strength of strong coupling between the Fabry-Perot resonator and the plasmons is further increased by partially embedding the gold nanostructure in the second dielectric layer as in the light absorbing device according to the embodiment of the present invention.

Example 4

1. Production of Light Absorbing Device

A gold thin film having a thickness of 100 nm was formed by sputtering (light reflecting layer) on a glass plate as a supporting substrate. The glass plate on which the gold thin film was formed was immersed in an ethanol solution of 2-mercaptoethanol (50 mg/mL) for 24 hours, and a surface treatment was performed to add hydroxyl groups to the surface of the gold thin film. A titanium oxide ($TiO_2$) thin film (first dielectric layer) of 30 nm thickness was formed using an atomic layer deposition apparatus on the surface-treated gold thin film. A gold thin film having a thickness of 3 nm was formed by vacuum evaporation on a titanium oxide thin film, and this gold thin film was annealed at 300° C. for 2 hours into particles so as to form a plurality of gold nanoparticles (metal nanostructures) each having a substantially spherical shape. The average particle size of the gold nanoparticles was 12 nm. Finally, a titanium oxide thin film (second dielectric layer) having a thickness of 7 nm was formed again using the atomic layer deposition apparatus. At this time, the titanium oxide thin film was formed without performing a surface treatment using 2-mercaptoethanol, and thus a titanium oxide thin film having a predetermined thickness was formed between the plurality of gold nanoparticles without forming the titanium oxide thin film on the plurality of gold nanoparticles. As a result, substantially all of the gold nanoparticles were partially buried in the titanium oxide thin film (partially exposed to the outside).

2. Evaluation of Light Absorbing Device

Figure 14:
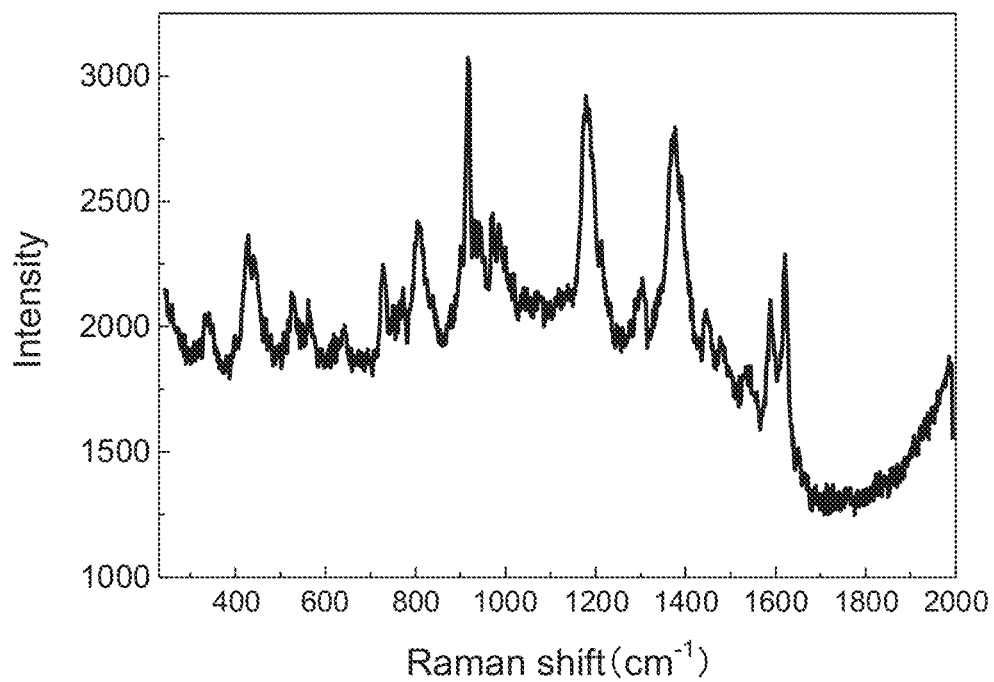
FIG. 14 is a graph showing a surface enhanced Raman scattering spectrum of crystal violet molecules.

The surface-enhanced Raman scattering spectrum of the produced light absorbing device was measured using a microscopic Raman measurement device. To gold nanoparticles in a 0.1 mM-crystal violet aqueous solution, condensed excitation light having a wavelength of 532 nm was applied using a water immersion objective lens (magnification: 63 times, numerical aperture: 0.9) to obtain a surface enhanced Raman scattering spectrum of crystal violet molecules. FIG. 14 is a graph showing a surface enhanced Raman scattering spectrum of crystal violet molecules. This graph shows that the spectrum can be measured in a wide Raman-Shift area of 300 cm$^{-1}$ to 2000 cm$^{-1}$. That is, the light absorbing device according to the embodiment of the present invention is also useful in the surface enhanced Raman scattering measurement that requires the contribution of plasmon enhancement in both the excitation wavelength and the scattering wavelength.

This application claims priority to U.S. Patent Application No. 2017-248071, filed Dec. 25, 2017. The contents described in the application specification and drawings are hereby incorporated by reference in their entirety.

INDUSTRIAL APPLICABILITY

The light absorbing device and the photoelectrode according to the embodiment of the present invention may be utilized in a variety of light energy conversion systems such as solar cells and artificial photosynthesis, for example.

REFERENCE SIGNS LIST

100 Light absorbing device
110 Supporting substrate
120 Light reflecting layer
130 Dielectric layer
140 Metal nanostructures

What is claimed is:

1. A light absorbing device comprising:
   a light reflecting layer;
   a dielectric layer disposed on the light reflecting layer; and
   a plurality of metal nanostructures disposed on the dielectric layer,
   wherein each of the plurality of metal nanostructures is partially embedded in the dielectric layer and is exposed to outside in a portion other than a portion embedded in the dielectric layer,
   wherein the plurality of metal nanostructures generate localized surface plasmon resonance when irradiated with light; and
   wherein the light reflecting layer and the dielectric layer function as a Fabry-Perot resonator when irradiated with light;
   wherein a resonant wavelength of the Fabry-Perot resonator falls within a range of a peak wavelength of the localized surface plasmon resonance ±a half width of a peak of the localized surface plasmon resonance.

2. The light absorbing device according to claim 1, wherein a proportion of a volume of the plurality of metal nanostructures each of which is partially embedded in the dielectric layer and is exposed to the outside in a the portion other than the portion embedded in the dielectric layer in a total volume of all of the plurality of metal nanostructures that are in contact with the dielectric layer is 90% or more.

3. A photoelectrode comprising the light absorbing device according to claim 1.

4. A photoelectrode comprising the light absorbing device according to claim 2.

5. A method of manufacturing a light absorbing device comprising:
   preparing a metal layer as a light reflecting layer;
   forming a first dielectric layer on a surface of the metal layer;
   forming a plurality of metal nanostructures on the first dielectric layer; and
   forming a second dielectric layer on the first dielectric layer by an atomic layer deposition method such that the plurality of metal nanostructures are not completely buried,
   wherein the plurality of metal nanostructures are formed to generate localized surface plasmon resonance when irradiated with light, and
   wherein the light reflecting layer, the first dielectric layer and the second dielectric layer are formed to function as a Fabry-Perot resonator when irradiated with light,
   wherein a resonant wavelength of the Fabry-Perot resonator falls within a range of a peak wavelength of the localized surface plasmon resonance ±a half width of a peak of the localized surface plasmon resonance.

6. The method according to claim 5, wherein in the forming of the second dielectric layer, the second dielectric layer is formed on the first dielectric layer by the atomic layer deposition method without performing a surface treatment of adding a hydroxyl group to surfaces of the plurality of metal nanostructures.

7. The method according to claim 6, wherein in the forming of the first dielectric layer, after the surface treatment of adding the hydroxyl group to the surface of the metal layer is performed, the first dielectric layer is formed by the atomic layer deposition method on the surface of the metal layer which has been subjected to the surface treatment.

* * * * *